(12) United States Patent
McKenzie et al.

(10) Patent No.: US 7,502,245 B2
(45) Date of Patent: Mar. 10, 2009

(54) CONTENT ADDRESSABLE MEMORY ARCHITECTURE

(75) Inventors: Robert N. McKenzie, Ottawa (CA); Dieter Haerle, Kanata (CA); Sean Lord, Stitsville (CA)

(73) Assignee: MOSAID Technologies, Inc., Kanata (CA)

( * ) Notice: Subject to any disclaimer, the term of this patent is extended or adjusted under 35 U.S.C. 154(b) by 0 days.

(21) Appl. No.: 11/787,667

(22) Filed: Apr. 17, 2007

(65) Prior Publication Data

US 2008/0025059 A1 Jan. 31, 2008

Related U.S. Application Data

(63) Continuation of application No. 11/359,877, filed on Feb. 21, 2006, now abandoned, which is a continuation of application No. 10/912,768, filed on Aug. 5, 2004, now Pat. No. 7,002,824, which is a continuation of application No. 10/234,033, filed on Aug. 30, 2002, now Pat. No. 6,775,166.

(51) Int. Cl.
  *G11C 15/00* (2006.01)
(52) U.S. Cl. ............... 365/49.17; 365/49.1; 365/189.07; 365/230.03
(58) Field of Classification Search ............... 365/49.17, 365/49.1, 189.07, 230.03
  See application file for complete search history.

(56) References Cited

U.S. PATENT DOCUMENTS

| | | | |
|---|---|---|---|
| 5,930,359 A | | 7/1999 | Kempke et al. |
| 6,137,707 A | * | 10/2000 | Srinivasan et al. ........ 365/49.15 |
| 6,249,449 B1 | | 6/2001 | Yoneda et al. |
| 6,301,636 B1 | * | 10/2001 | Schultz et al. ............... 711/108 |
| 6,324,087 B1 | * | 11/2001 | Pereira .................... 365/49.16 |
| 6,362,990 B1 | * | 3/2002 | Gibson et al. .............. 365/49.1 |
| 6,470,418 B1 | | 10/2002 | Lien et al. |
| 6,577,519 B1 | | 6/2003 | Avramescu |
| 6,584,003 B1 | | 6/2003 | Kim et al. |
| 6,591,331 B1 | | 7/2003 | Khanna |
| 6,690,595 B1 | * | 2/2004 | Srinivasan et al. ........ 365/49.17 |
| 6,708,250 B2 | * | 3/2004 | Gillingham .................. 711/108 |

(Continued)

FOREIGN PATENT DOCUMENTS

| | | |
|---|---|---|
| EP | 0 227 348 A2 | 7/1987 |
| JP | 2001236790 | 8/2001 |

OTHER PUBLICATIONS

Clark, L.T. and Grondin, R.O., "A Pipelined Associative Memory Implemented in VLSI," *I.E.E.E. Journal of Solid-State Circuits* 24(1):28-34, (1989).

(Continued)

*Primary Examiner*—Pho M. Luu
(74) *Attorney, Agent, or Firm*—Hamilton, Brook, Smith & Reynolds, P.C.

(57) ABSTRACT

A Content Addressable Memory array includes a plurality of coupled sub-blocks arranged in rows and columns. Search data received by a first sub-block in a first column of the CAM is propagated to each sub-block in the row to the last sub-block in the last column of the CAM. The search result for the CAM is selected based on the propagated search results for each row of sub-blocks and output on a side of the array opposite from the side receiving the search data.

20 Claims, 12 Drawing Sheets

U.S. PATENT DOCUMENTS

| | | | |
|---|---|---|---|
| 6,775,166 B2 * | 8/2004 | McKenzie et al. | 365/49.18 |
| 6,867,989 B1 * | 3/2005 | Roy | 365/49.17 |
| 7,002,824 B2 | 2/2006 | McKenzie et al. | |
| 2002/0073073 A1 | 6/2002 | Cheng | |
| 2002/0080665 A1 | 6/2002 | Hata | |
| 2006/0239054 A1 * | 10/2006 | McKenzie et al. | 365/49 |

OTHER PUBLICATIONS

Ghose, Kanad, "The architecture of response-pipelined content addressable memories," *Microprocessing and Microprogramming*, 40(6):387-410, (1994).

* cited by examiner

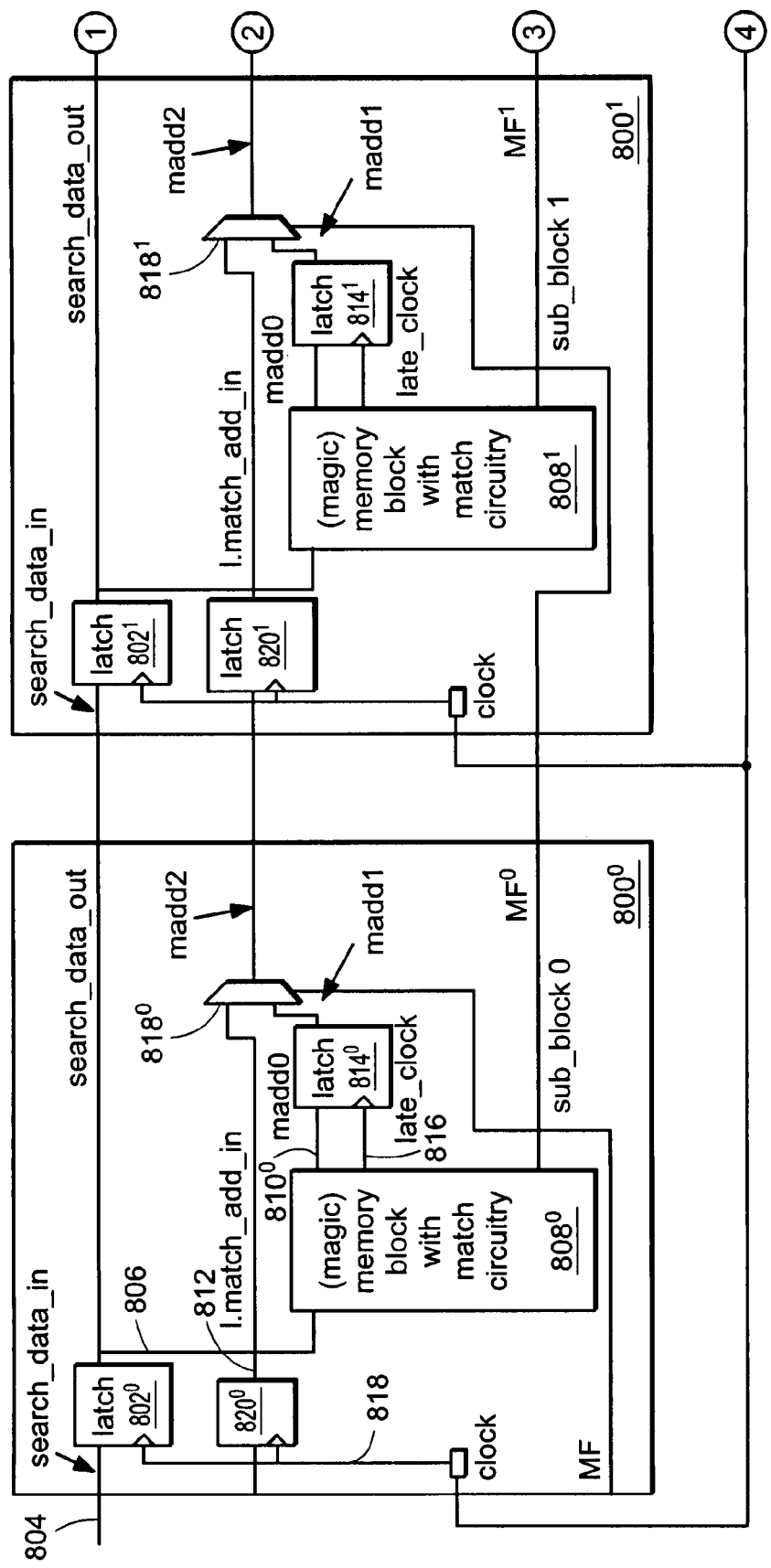

CONTENT ADDRESSABLE MEMORY ARCHITECTURE

RELATED APPLICATIONS

This application is a continuation of U.S. application Ser. No. 11/359,877, filed Feb. 21, 2006, now abandoned which is a continuation of U.S. application Ser. No. 10/912,768, filed Aug. 5, 2004, now U.S. Pat. No. 7,002,824, which is a continuation of U.S. application Ser. No. 10/234,033, filed Aug. 30, 2002, now U.S. Pat. No. 6,775,166. The entire teachings of the above applications are incorporated herein by reference.

BACKGROUND OF THE INVENTION

A Content Addressable Memory ("CAM") includes a plurality of CAM cells arranged in rows and columns. As is well-known in the art, a CAM cell can be dynamic memory based or static memory based and can be a binary cell or a ternary cell. A binary CAM cell has two possible logic states '1' and '0'. A ternary CAM cell has three possible logic states '0', '1' and don't care ('X') encoded in two bits.

A search and compare feature allows all of the CAM cells in the CAM to be searched for an entry with data that matches a search key. An entry can include a plurality of CAM cells. For example, a 72-ternary bit entry includes 72 ternary CAM cells. If an entry matching the search key is stored in the CAM, the address of the matching entry, that is, the match address, a match flag indicating whether there is a match and a multiple match flag indicating whether there are more than one match are typically provided. The match address may be used to find data associated with the search key stored in a separate memory in a location specified by the match address.

Each entry in the CAM has an associated match line coupled to each CAM cell in the entry. Upon completion of the search, the state of the match line for the entry indicates whether the entry matches the search key. The match lines from all entries in the CAM are provided to a match line detection circuit to determine if there is a matching entry for the search key in the CAM and then the result of the match line detection circuit is provided to a priority encoder. The priority encoder selects the match entry with the highest priority if there are a plurality of match entries for the search key in the CAM. The priority encoder also provides the match address and a match flag. The match flag is enabled when there is at least one match/hit.

Typically, a CAM with a large number of CAM cells is subdivided into a plurality of banks. FIG. 1 illustrates a simplified prior art CAM 100 subdivided into a plurality of banks 102A-D, with each bank including entries comprising a plurality of CAM cells (not shown) and a supporting circuit (not shown) for the bank. Search data 104 for a search and compare operation is received at external pins of the CAM 100, routed to the center of the CAM, then routed from the center to each of the banks. The path from the external search data pin to bank 0 102a is shown as trace 106. A search for a matching entry for the search data is performed in parallel in each bank 102A-D. Upon completing a search operation for search data, each bank performs operations including priority encoding to select the match address for the highest priority matching entry stored in the respective bank. The result of the search in each bank is collected by the CAM output logic circuit 108. The CAM output logic circuit 108 is located in the center of the CAM 100. A priority encoder in the CAM output logic circuit 108 selects the highest priority matching entry from the result of the search in each bank, adds a bank identifier to the matching entry and outputs the match address 110 for the highest priority matching entry for the search word and a match flag. The operation of a priority encoder has been described but operations for other output results typically provided by a CAM such as, a match flag and a multiple match flag are also operative as known by those skilled in the art.

SUMMARY OF THE INVENTION

As described above, search data is routed to the center from external pins, then routed to each bank. After performing an operation, the result data from each bank is returned to the center. In order to support the result data and search data paths, all connecting traces are concentrated in the center, thereby making the center area bigger and distances between each bank wider. Therefore area efficiency of silicon is decreased because the center area must be reserved for the connecting traces and supporting circuit.

Routing congestion is avoided by replacing the plurality of banks with an array of sub-blocks. All of the data is input on one side of the array of sub-blocks and routed across each row of the array. Results are output on the opposite side of the array to the input data. The issue of latency is addressed with an optional pipeline stage in each sub-block. All of the pipeline stages are enabled resulting in higher latency when operating at a high clock speed. When the array is operated at a lower clock speed, some or all of the pipe stages can be bypassed and latency reduced.

Instead of routing all data lines and result lines to the center of the CAM, the present invention arranges data lines across each row of sub-blocks and forwards the result of a search of each sub-block to the next subsequent sub-block in the row. The results of the search in each row of sub-blocks are coupled to a priority encoder to select the match address for the highest priority matching entry stored in a matching entry in a sub-block in the array.

A Content Addressable Memory includes a plurality of data inputs for receiving data, an array of content addressable sub-blocks and a plurality of outputs for the results of operations in rows of sub-blocks in the array. The plurality of outputs are located on the side of the array opposite to the data inputs. Each sub-block in a first column of the array is coupled to the plurality of data inputs. Data received by a sub-block in a row in the first column of the array is propagated across the array to each subsequent sub-block in the row of the array. The Content Addressable Memory also includes priority encoder logic coupled to each sub-block in a last column in the array for selecting a highest priority row match output for the result of a search and compare operation. The priority encoder logic also provides a match flag and a match address corresponding to the selected highest priority matching entry.

Each sub-block comprises a plurality of cell arrays. The received data includes search data and each sub-block performs a search for a match for the search data stored in the plurality of cell arrays. Each sub-block in a row forwards a match flag and a sub-block match address dependent on the result of the search in the sub-block and the result of searches in all previous sub-blocks in the row to the next sub-block in the row.

Each sub-block in a row is coupled to a next sub-block in a subsequent column for forwarding received data and results to the next subsequent sub-block. Entries with highest priority may be stored in sub-blocks in the first column. A match in a sub-block in a previous column overrides a match in a sub-block in a subsequent column. Each sub-block may include a pipeline stage for latching the received data and the operation results prior to forwarding the received data to the next sub-block in the row. The pipeline stage may be enabled to increase latency or bypassed to decrease latency.

The number of columns in the array may be four and the number of rows in the array may be 32 or 16. Each cell array may include a plurality of dynamic random access memory based cells or static random access memory based cells. The cell may be ternary or binary. The operation may be a read, write or search and compare.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 8A-8B is a block diagram illustrating the search and compare path across a row of sub-blocks in the CAM shown in FIG. 2A.

DETAILED DESCRIPTION OF THE INVENTION

A description of preferred embodiments of the invention follows.

Figure 1:
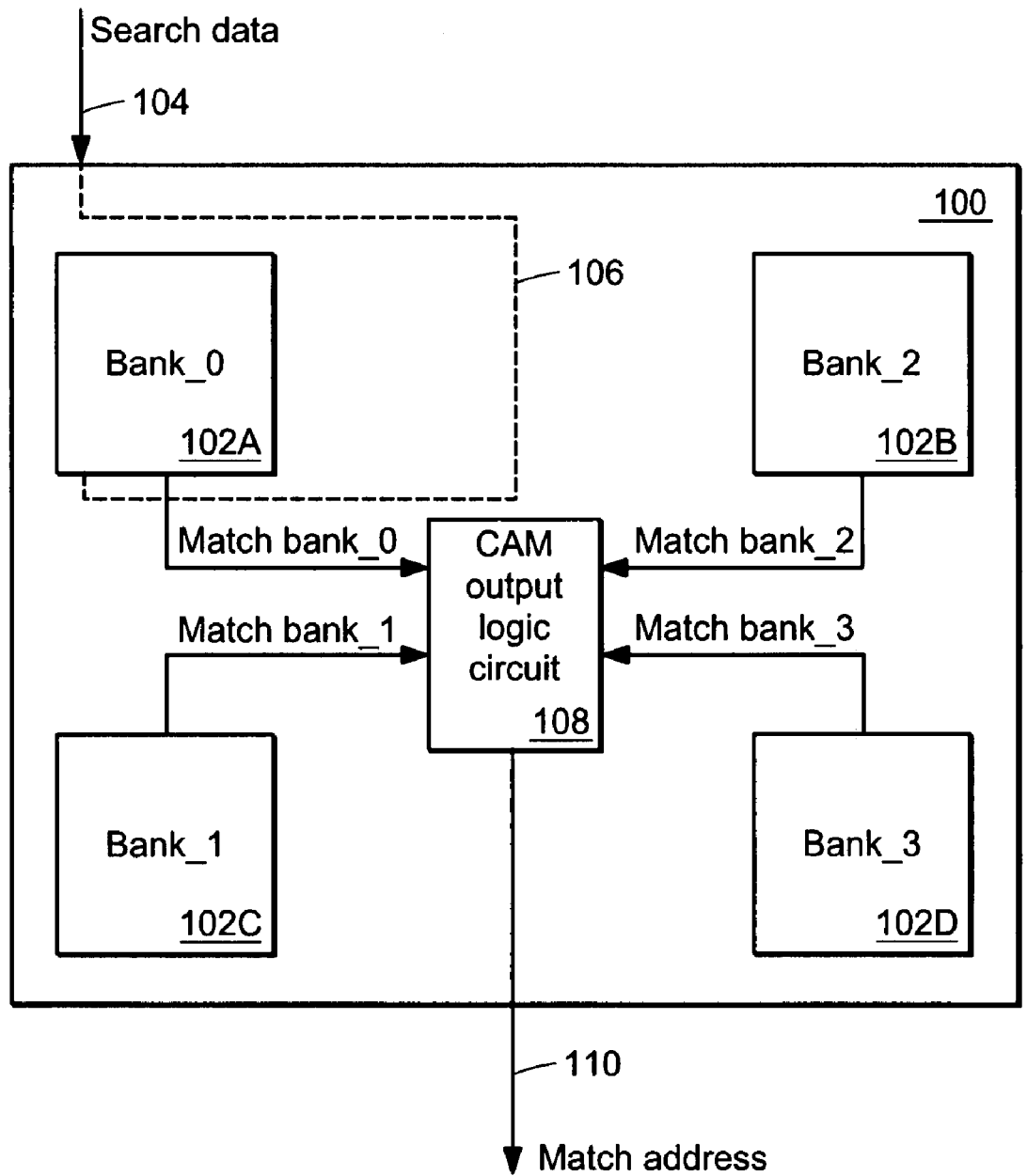
FIG. 1 illustrates a simplified prior art CAM subdivided into a plurality of banks, with each bank including entries comprising a plurality of CAM cells.
Figure 2A:
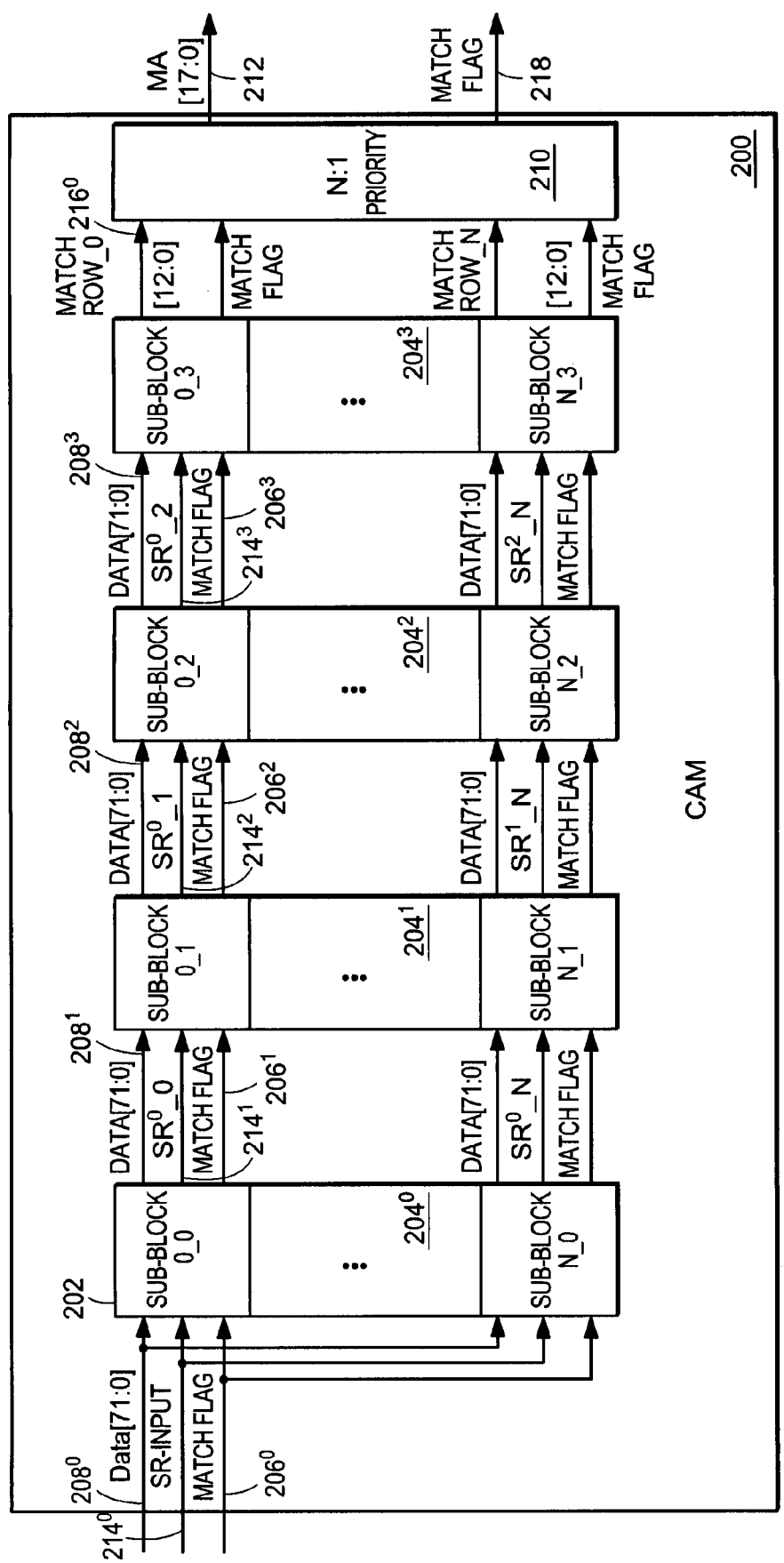
FIG. 2A illustrates data paths and search result paths in a CAM including an array of content addressable sub-blocks according to the principles of the present invention.

FIG. 2A illustrates data paths and search result paths in a CAM 200 including an array of content addressable sub-blocks 0_0 to N_3 according to the principles of the present invention. Instead of routing all input signals (search data and read/write data) and output signals including a match address through the center of the CAM as shown in the prior art CAM in FIG. 1, output signals including a match address are output at the opposite side to all input signals. Only data paths and a few of the result data signals are illustrated for simplicity. The data can be search data, read data or write data. The type of operation is dependent on the state of control signals. The invention is described for a search operation. The result data signals include a match address, match flag and multi-match flag. The SR_input signal and a match flag in each sub-block $204^0$ in the first column allow CAMs to be cascaded. They are used to receive search results from another cascaded CAM. If only one CAM is used, the SR_input signal and a match flag in the sub-blocks $204^0$ in the first column are tied to ground.

The search begins in the first column of sub-blocks $204^0$ and ends in a last column of sub-blocks $204^3$. The result of the search in a sub-block in a column is coupled to a subsequent sub-block in the same row in the next column. Each sub-block performs a search for a matching entry and forwards the address of the highest priority match 214 and a match flag if there is a matching entry to the subsequent sub-block. The highest priority match address forwarded is either the matching address from a sub-block in a previous column or the highest matching address in the current sub-block. The decision is made by examining a match flag from the previous column. The highest priority matching addresses propagated across all of the rows in the array are coupled to a priority encoder 210. The priority encoder 210 selects the highest priority matching entry for the CAM and outputs the highest priority match address and a match flag.

As shown, the CAM 200 includes a plurality of columns $204^0$-$204^3$ with each column $204^0$-$204^3$ having a plurality of sub-blocks 202. Each sub-block 202 includes a plurality of CAM cells and supporting circuits (not shown). The sub-block is described later in conjunction with FIG. 3. The CAM 200 supports write, read and search and compare operations. Data for read/write operations and search and compare operations is transferred through the data lines 206. A search and compare operation searches each sub-block for an entry matching the search data on the data lines 208. After the search of all of the sub-blocks in the CAM has been completed, the address of the highest priority matching entry is output on match address (MA) 212 and a match flag is output on a match flag (MF) 218 on a side of the CAM opposite to the side receiving the search data.

External data pins of the CAM 200 are coupled to sub-blocks 0_0 to 0_N in the first column $204^0$ of the CAM 200. The received search/read/write data 206 is received on the external data pins and propagated across the CAM through each row of sub-blocks in column_0 $204^0$, column_1 $204^1$, column_2 $204^2$, and column_3 $204^3$. A sub-block in each row of the CAM 200 is coupled to the sub-block in the previous column for receiving the search/read/write data and search results (SR) and a match flag. Search results from the sub-blocks 0_3 to N_3 in the last column $204^3$ of the CAM 200 are coupled to a priority encoder 210. The priority encoder selects the highest priority result of the search and compare from all rows of sub-blocks in the CAM.

Each sub-block also includes a pipeline stage for latching the data, control signals and result data. The pipeline stage allows the CAM to be operated at a higher clock speed by increasing latency. At a lower clock speed, one or more of the pipeline stages can be disabled to decrease latency. The data path through each sub-block and the pipeline stage is described later in conjunction with FIG. 6A-6B.

The operation of the CAM with four columns and N sub-blocks per column as shown in FIG. 2A is described for a search and compare operation. Upon receiving a search and compare instruction along with the search data 208, each sub-block 202 performs a search for a highest priority matching entry for the search data 208. The highest priority matching entry is stored in the address closest to zero. The sub-blocks in the first column have the lowest addresses and the sub-blocks in the last column have the highest addresses. Thus, the priority of matching entries decreases from the first column to the last column. The result of each sub-block search is output as a respective sub-block search result 214. The sub-block search result 214 is selected as the result of search in the current sub-block or the sub-block search result forwarded from a previous sub-block.

If the sub-block search result from the previous block contains a match, the result from the previous sub-block is selected because the previous sub-block stores higher priority entries. Thus, a match in a sub-block in a previous column overrides a match in a subsequent column. For example, a highest priority match address and a match flag in a sub-block in the first column are propagated to all of the sub-blocks in the row and output as the highest priority match address with a match flag for the row. The search results of sub-blocks in each column are propagated across through each subsequent sub-block in the row of sub-blocks. The search result from the sub-block in the last column in the row is output as the row match address 216 with a match flag. The row match address 216 is the highest priority match address stored in the respective row of sub-blocks.

Figure 2B:
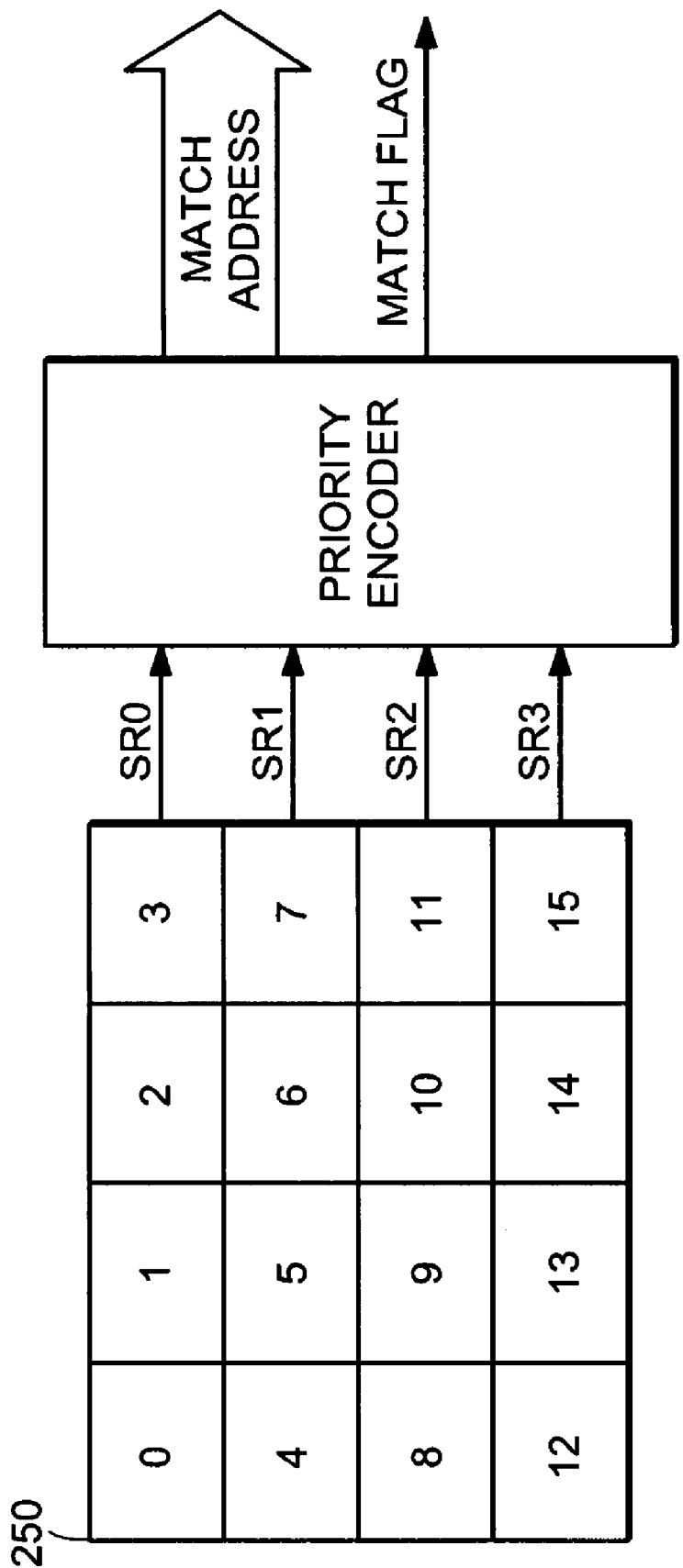
FIG. 2B illustrates one priority assignment for sub-blocks in the CAM.

FIG. 2B illustrates one priority assignment for sub-blocks in the CAM. An array of sub-blocks 250 is coupled to a priority encoder. The array of sub-blocks has 16 sub-blocks arranged in rows and columns with four rows and four columns. Priority is assigned to the sub-blocks from left to right and top to bottom with the left-most sub-block in the top row having the highest priority and the right most sub-block in the bottom row having the lowest priority. As shown, sub-block 0 in the left column of the top row has the highest priority and sub-block 15 in the right column of the bottom row has the lowest priority.

The search results from the sub-blocks in each row are coupled to a priority encoder. The search result for row 0 (SR0) is the highest priority search result and the search result for row 3 (SR3) is the lowest priority result. If the search result for row 0 indicates a matching entry has been found in sub-blocks 0-3, all other search results are ignored and the match address and match flag are output based on search results for row 0.

Returning to FIG. 2A, the match addresses and match flags of sub-blocks in the last column are coupled to a priority encoder 210. The priority encoder 210 selects the highest priority match entry for the CAM and outputs the match address 212 and a match flag 218 for the search key. The match address 212 is coupled to external pins on the CAM. If there is more than one matching entry, the priority encoder 210 can output all matching addresses in order of priority, for example, in response to a command to "output all matching entries" for a search key. Routing the search/read/write data and search results across the row of sub-blocks in the array eliminates the routing congestion problem in the center of the CAM array as discussed in conjunction with the prior art four bank CAM shown in FIG. 1.

Figure 3:
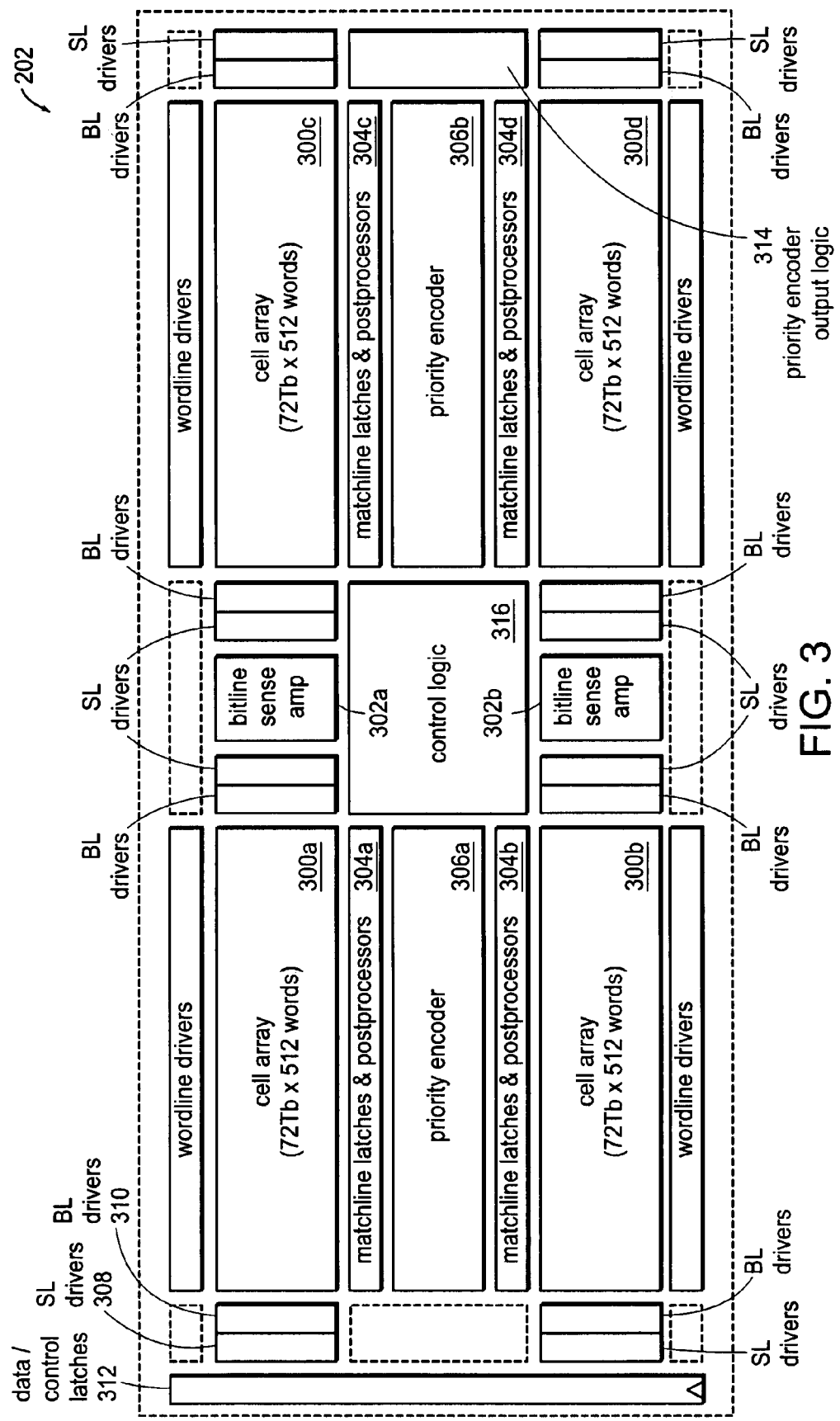
FIG. 3 is a block diagram of one of the sub-blocks in the CAM array shown in FIG. 2A.

FIG. 3 is a block diagram of any one of the sub-blocks 202 in the CAM 200 shown in FIG. 2A. The sub-block 202 includes four cell arrays 300a-d separated horizontally by bitline sense amplifiers 302a, 302b, and vertically by search result processing circuitry. The search result processing circuitry includes match line latches and post processors 304a-d and priority encoders 306a, 306b. Each cell array 300a-d also includes redundant words, redundant columns, status bits and empty bits as is well known in the art.

The data flow across the sub-block 202 is from left to right. The pipeline stage includes the data and control latches 312. If the pipeline stage is enabled, data and control signals for search and read/write operations are synchronously latched in the data and control latches 312. The latched/unlatched data and control signals are driven across the sub-block 202 to bitline drivers 310, searchline drivers 308 and control blocks including control logic 316. In addition, these signals are driven to the right side of the block to be synchronously latched by another adjoining sub-block.

During a search and compare operation, the match lines from all rows in all of the cell-arrays 300a-d are sensed and stored in the respective match line latches 304a-d. Data from the latched match lines is provided to a priority encoder 306a. Priority encoder 306a provides the highest priority match address and a match flag for the result of searches in cell array 300a and cell array 300b. Cell arrays 300c, 300d are searched in parallel with cell arrays 300a, 300b. The result of the searches is sensed and stored in respective latches 304c, 304d and provided to a priority encoder 306b. Priority encoder 306b provides the highest priority match address and a match flag for the result of the searches in cell array 300c and cell array 300d. The highest priority match address is the match address closest to zero.

Priority encoder output logic 314 performs the last stage of the priority encoding of a sub-block by selecting match flags and the highest priority match address from priority encoders 306a, 306b. Priority encoder output logic 314 also prioritizes the result of the previous sub-block over the current sub-block. The highest priority match address and a match flag of matching entry stored in each of the cell array pairs 300a-b, 300c-d are provided by the respective priority encoder 306a, 306b and the highest priority entry is selected by examining the match flags provided. Thus, each sub-block 202 provides an address of the highest priority matching entry stored in one of the cell-arrays 300 in the sub-block and a match flag.

Returning to FIG. 2A, in one embodiment, an 18 Megabit CAM includes four columns $204^0$-$204^3$, with each column having 32 sub-blocks. Continuing with FIG. 3, each cell array stores 512 entries with each entry having 72-bits. Thus, the sub-block with four cell arrays can store a total of 2048 entries with each entry having 72-bits. With 2048 entries each entry having 72-bits in each sub-block, the 18 Meg CAM with 128 sub-blocks can be configured with 256K entries each having 72 bits, 128K entries each having 144 bits or 64K entries each having 288 bits. However, the invention is not limited to an 18 Megabit CAM array. The number of bits in the CAM 200 is dependent on the number of columns and the number of sub-blocks per column. For example, a 9 Megabit CAM includes four columns, with each column having sixteen sub-blocks and each sub-block having 2048 entries each having 72 bits.

Returning to FIG. 2A, an 18 bit match address [A17:A0] 212 identifies the 256K 72-bit word locations in an 18 Megabit CAM. The most significant bits [A17:A13] of the match address 212 identify the row of sub-blocks storing the matching entry. The next two bits of the match address 212; that is, A12 and A11 identify one of the four columns within the row of sub-blocks, the next eleven bits [A10:A0] of the match address identify the location of the matching entry within the sub-block.

The sub-block search result 214 from each sub-block 202 includes thirteen bits [MA12:MA0]. Address bits [MA10-MA0] identify the 2048 72-bit word locations in each sub-block 202. Address bits [MA12-MA11] identify a column of the row of sub-blocks The priority encoder receives the 13-bit match address from the last column in each of the 32 rows and the associated match flag. The priority encoder provides the 5 MSBs of the match address by encoding the 32 match flags output from the last column. Thus, only 13 bits of the match address are propagated through the CAM with the 5 MSBs of the match address computed by the priority encoder.

The size of the memory can be increased by cascading multiple CAMs. Each CAM is uniquely identified by a device identifier. When cascading CAMs, the number of match addresses propagated through the CAM increases to 18-bits. The 18-bit match address together with the device identifier uniquely identifies each entry in the plurality of CAMs.

Figure 4:
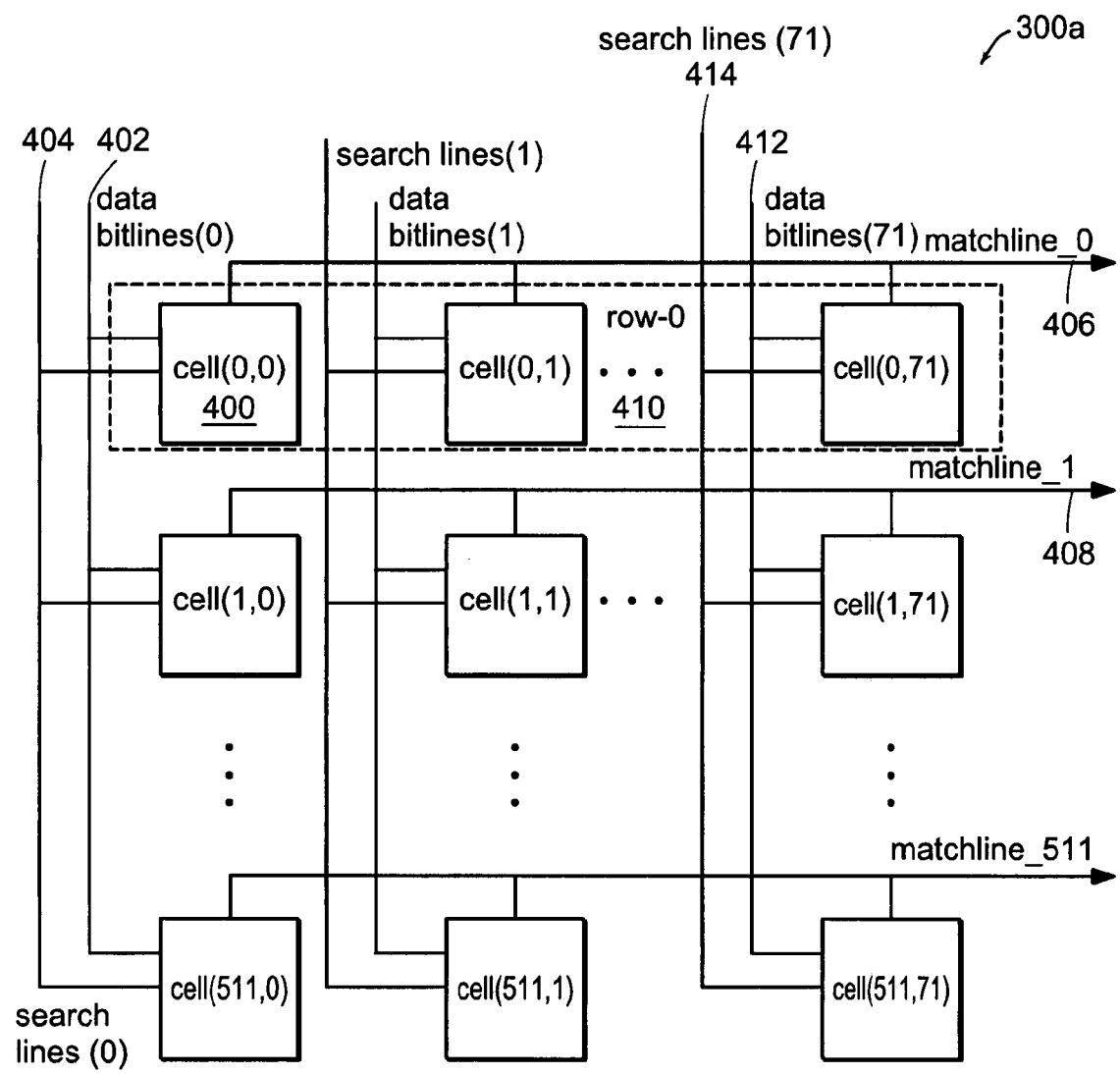
FIG. 4 is a block diagram of one of the cell arrays in the sub-block shown in FIG. 3.

FIG. 4 is a block diagram of one of the cell arrays 300a in the sub-block 202 shown in FIG. 3. The cell array 300a includes a plurality of CAM cells 400 arranged in rows and columns. In the embodiment shown, the cell array 300a can store 512 72-bit words with 72 CAM cells in each row by having 512 rows in the cell array 300a. The CAM cells 400 in a column are coupled to the same data bit lines 402 for a data read/write and search lines 404 for a search. As shown, data bit lines (0) 402 and search lines (0) 404 are coupled to each CAM cell 400 in the first column of CAM cell array 300a and data bit lines (71) 412 and search lines (71) 414 are coupled to each CAM cell in the last column of CAM cell array 300a.

Match lines from CAM cells in a row of CAM cells are coupled to provide a match indication for the word stored in the row. The state of matchline_0 406 coupled to all CAM cells in the first row indicates whether the 72-bit word stored in row_0 410 of the CAM cell array 300a matches all of the 72-bits of the search word provided on search lines during a search and compare operation.

Figure 5:
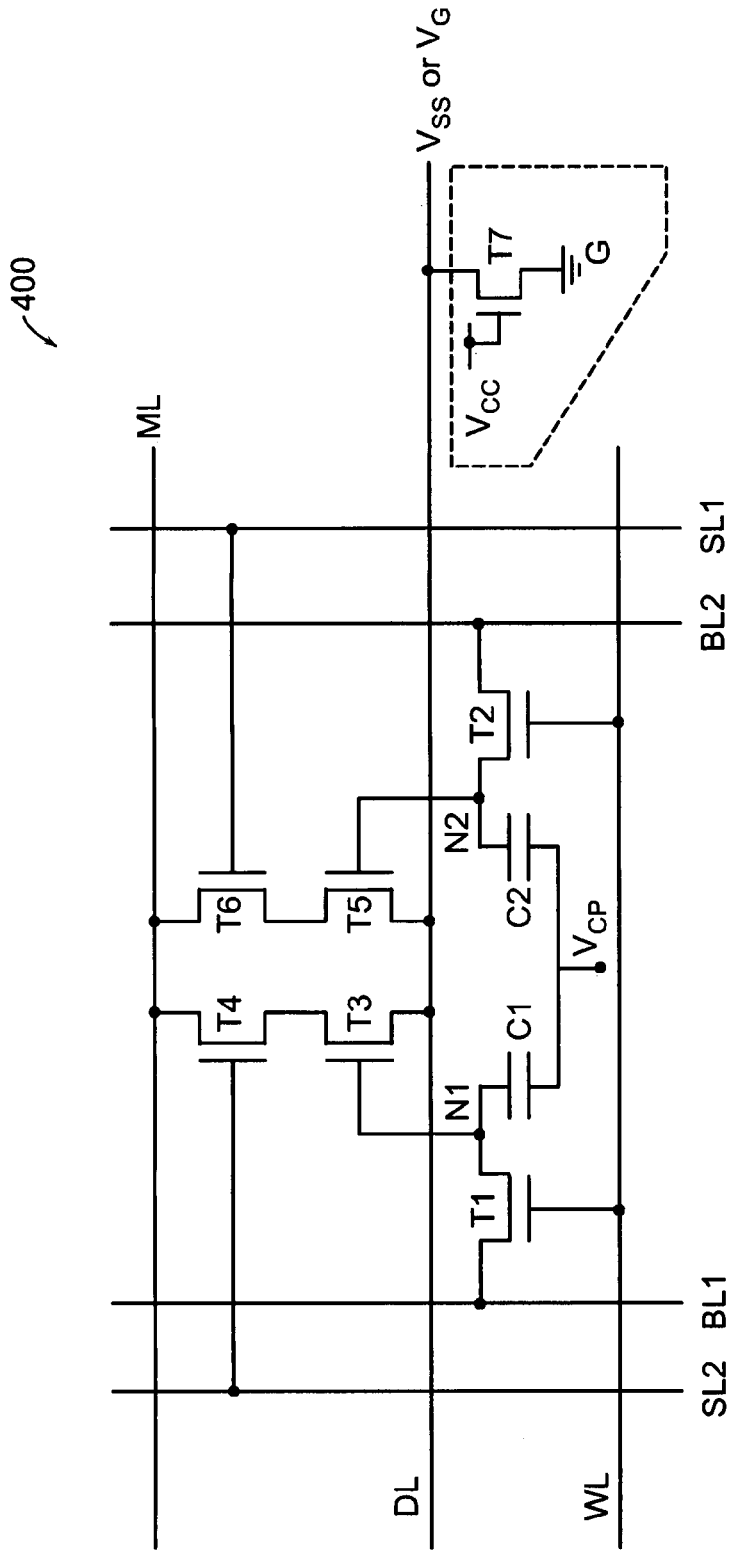
FIG. 5 is a block diagram of one embodiment of the CAM cell shown in FIG. 4.

FIG. 5 is a circuit diagram of one embodiment of any of the CAM cells 400 shown in FIG. 4. The DRAM based ternary CAM cell 400 can store three states: a logic '1', a logic '0' and 'don't care'. Capacitors C1 and C2 store the state of the CAM cell 400. The state of the CAM cell is a logic '0' or a logic '1' when capacitors C1 and C2 store complementary charges and the state is 'don't care' when both capacitors C1 and C2 are discharged. The DRAM based ternary CAM cell is described in U.S. Pat. No. 6,320,777, entitled "Dynamic Content Addressable Memory Cell" the contents of which are incorporated herein by reference in their entirety.

Bit lines BL1, BL2 correspond to data bitlines 402 shown in FIG. 4. Search lines SL1, SL2 correspond to search lines 404 shown in FIG. 4. Data is read from and written to the CAM cell 400 on bit lines BL1, BL2 through access devices T1, T2. A first bit line BL1 is coupled to the drain of access device T1. A second bit line BL2 is coupled to the drain of access device T2. The source of access device T1 is coupled to one terminal of capacitor C1. The source of access device T2 is coupled to one terminal of capacitor C2. The Word Line WL is coupled to the gate of access devices T1, T2 to enable writing data encoded on bit lines BL1, BL2 to the CAM cell or reading data stored in C1, C2. Transistors T1, T2 are turned 'on' by applying a high voltage level (close to the power supply terminal) to the word line WL. While turned 'on' by the word line WL, transistors T1, T2 conduct. To write data, the capacitors C1, C2 are charged to the voltage levels on respective bit lines BL1, BL2. To read data, the voltage levels on capacitors C1, C2 are coupled to the bit lines BL1, BL2.

A compare circuit including devices T3, T4, T5 and T6 allows the data stored in capacitors C1, C2 in the CAM cell to be compared with search data on search bit lines SL1, SL2. The result of the comparison is provided on a match line ML. Devices T4, T3 compare search line SL2 with the data stored in C1. Devices T6, T5 compare search line SL1 with the data stored in C2.

The second search line SL2 is coupled to the gate of device T4 and node N1 (the first terminal of capacitor C1) is coupled to the gate of T3. The first search line SL1 is coupled to the gate of device T6 and node N2 (the first terminal of capacitor C2) is coupled to the gate of device T5. At the beginning of the search and compare operation, the match line ML is pre-charged to a high voltage level (close to the power supply terminal). The drain of devices T3, T5 are coupled to the ground terminal. Different pre-charged level and sensing schemes can be used dependent on applied techniques.

Upon detecting a mismatch, a conduction path through devices T4, T3 or devices T5, T6 is made and the voltage on the match line ML discharges to a low voltage (close to ground). A mismatch is detected if both search line SL2 and node N1 are at a high voltage level allowing conduction through devices T4, T3 or both search line SL1 and node N2 are at a high voltage level allowing conduction through devices T5, T6 to discharge match line ML to ground. This invention is not limited to the DRAM based CAM cell, an SRAM based CAM cell can also be used.

Figure 6:
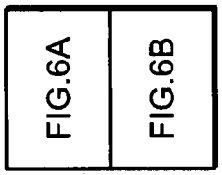
FIG. 6A-6B is a cross-section through the sub-block shown in FIG. 3 illustrating the forwarding of one of the received data bits through the sub-block.
Figure 6A:
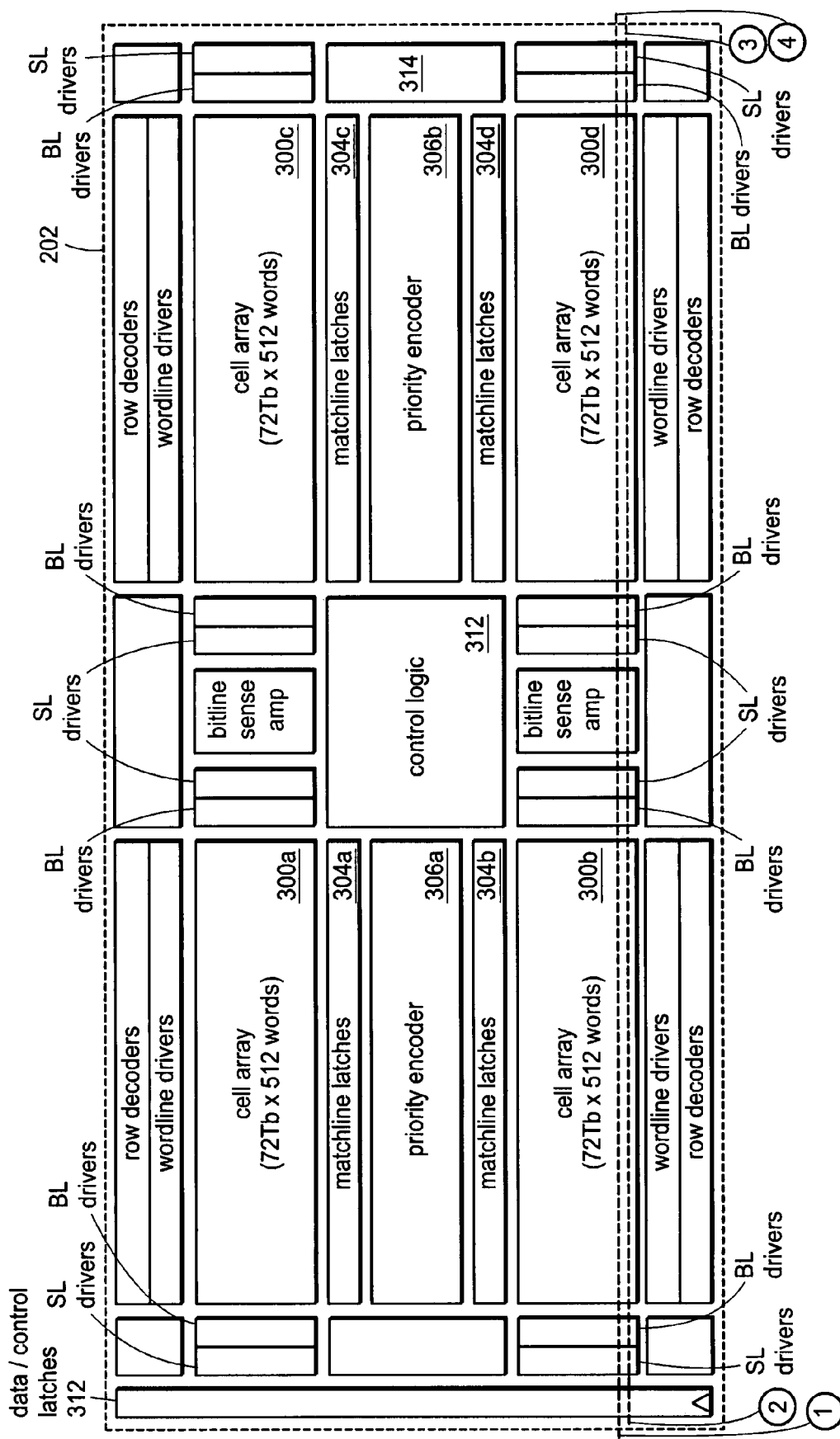
Figure 6B:
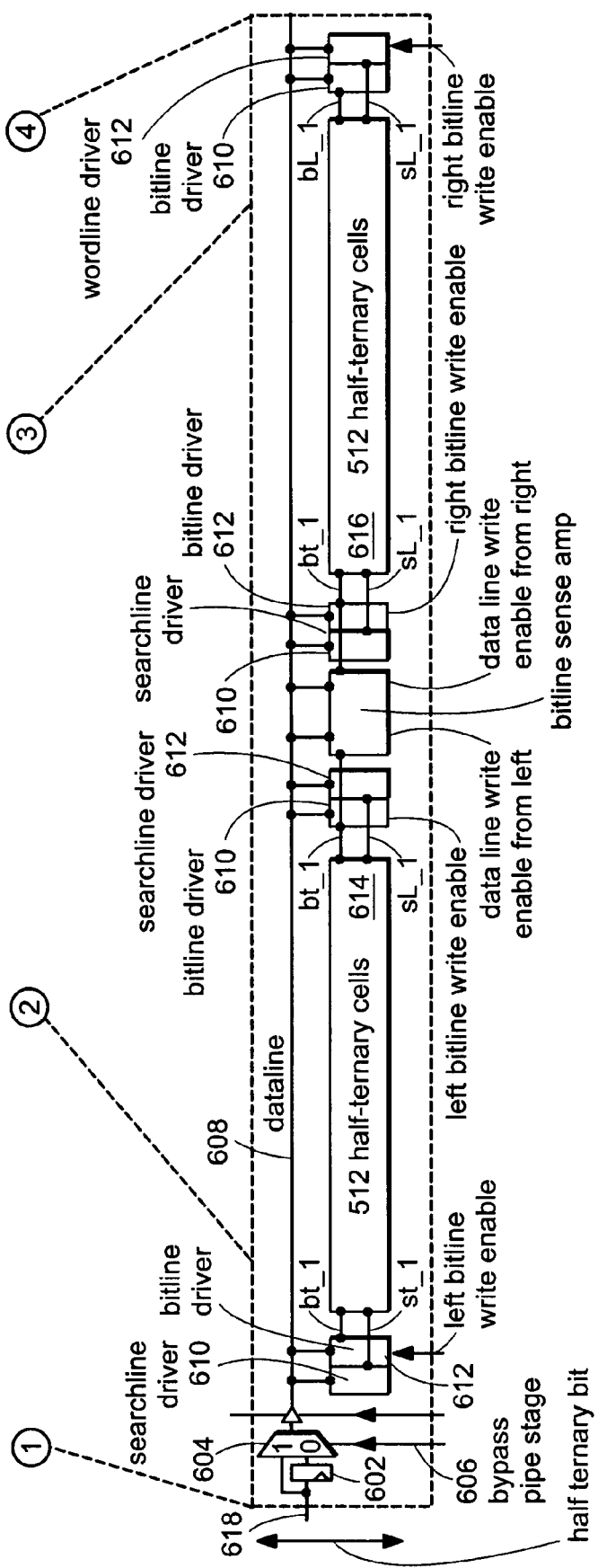

FIG. 6A-6B is a cross-section through the sub-block 202 illustrating the propagation of one of the received data bits (a search bit or a read/write data bit) across the sub-block 202. The cross-section illustrates 512 half cells, supporting circuits and connection lines in each side (left/right) of a row in the sub-block. The cross-section shows a data line 608 which is routed across the sub-block. The pipeline stage includes a latch 602 and multiplexer 604. The latch 602 latches the received input signal 618 (read/write bit or a search bit) received from the external pins or the previous sub-block in the row of the CAM. Data can be latched on the rising edge of a clock or the falling edge of the clock. In the embodiment shown data is latched on the rising edge of the clock. The pipeline stage allows the CAM to be operated at higher speeds to increase throughput (the number of searches per second) by increasing latency (the delay from issuing a command to receiving a result for the command). The received input signal can be bypassed dependent on the operating speed of the CAM.

The cross-section of the sub-block shows the latch 602 and multiplexer 604 in the data/control latches 312, the search line drivers 610 and bit line drivers 612 for the data line, the 512 half-ternary cells 614 corresponding to the dataline in cell array 300b, the 512 half ternary cells 616 corresponding to the dataline in cell array 300d. The control/data latches include a latch 602 for each control and data signal input to the sub-block 202. Each control and data signal is coupled both to the input of a latch 602 and to the input of a multiplexer 604. The latched control/data signal or the non-latched control/data signal is forwarded into the sub-block dependent on the state of the bypass pipeline-stage signal 606.

Figure 7:
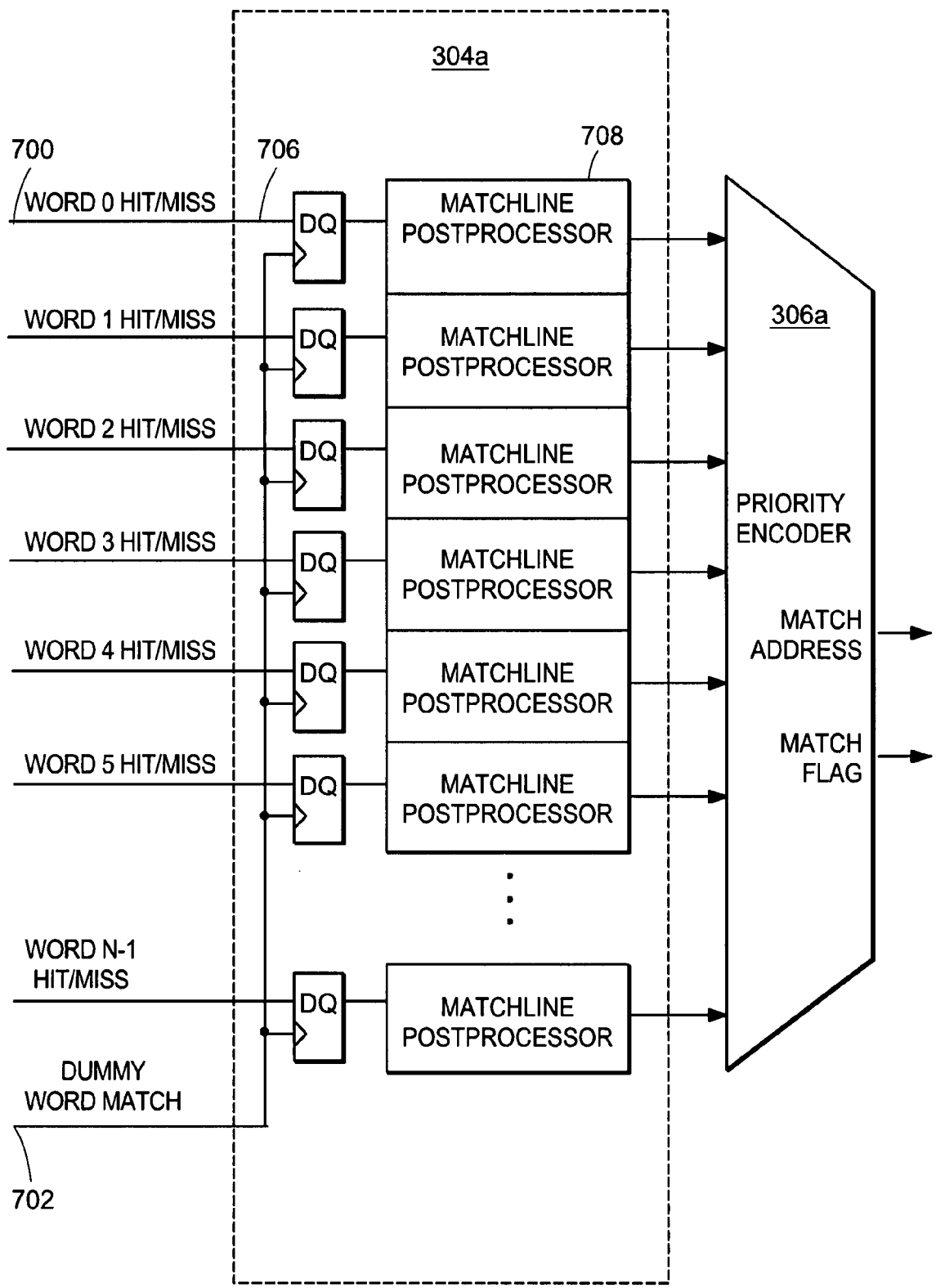
FIG. 7 is a block diagram of an embodiment of the match line latches and post processors logic and priority encoder shown in FIG. 3.

FIG. 7 is a block diagram of an embodiment of the match line latches and post processors logic 304a and priority encoder 306a shown in FIG. 3. The cell array 300a (FIG. 3) stores N words and a dummy word. The dummy word is always guaranteed to match all search words and becomes a reference signal to sense a match/mismatch of each word. Search data 208 (FIG. 2A) is driven into the cell array 300a (FIG. 3) when a search and compare command is received. The search data 208 (FIG. 2A) is compared to each word in the cell array 300a (FIG. 3) and a single bit hit/miss (or a match/mismatch) result per word 700 is driven to the respective match line latch 706 associated with each word. A dummy word match 702 clocks each latch 706 as each word hit is detected and each word's result bit is stored. Each word's latched result bit is driven through a respective match line postprocessor 708 and through to the priority encoder 306a, which determines the address of the highest priority matching entry; that is, the address closest to 0 that stores a match for the search data. The priority encoder 306a also provides a match flag.

Figure 8B:
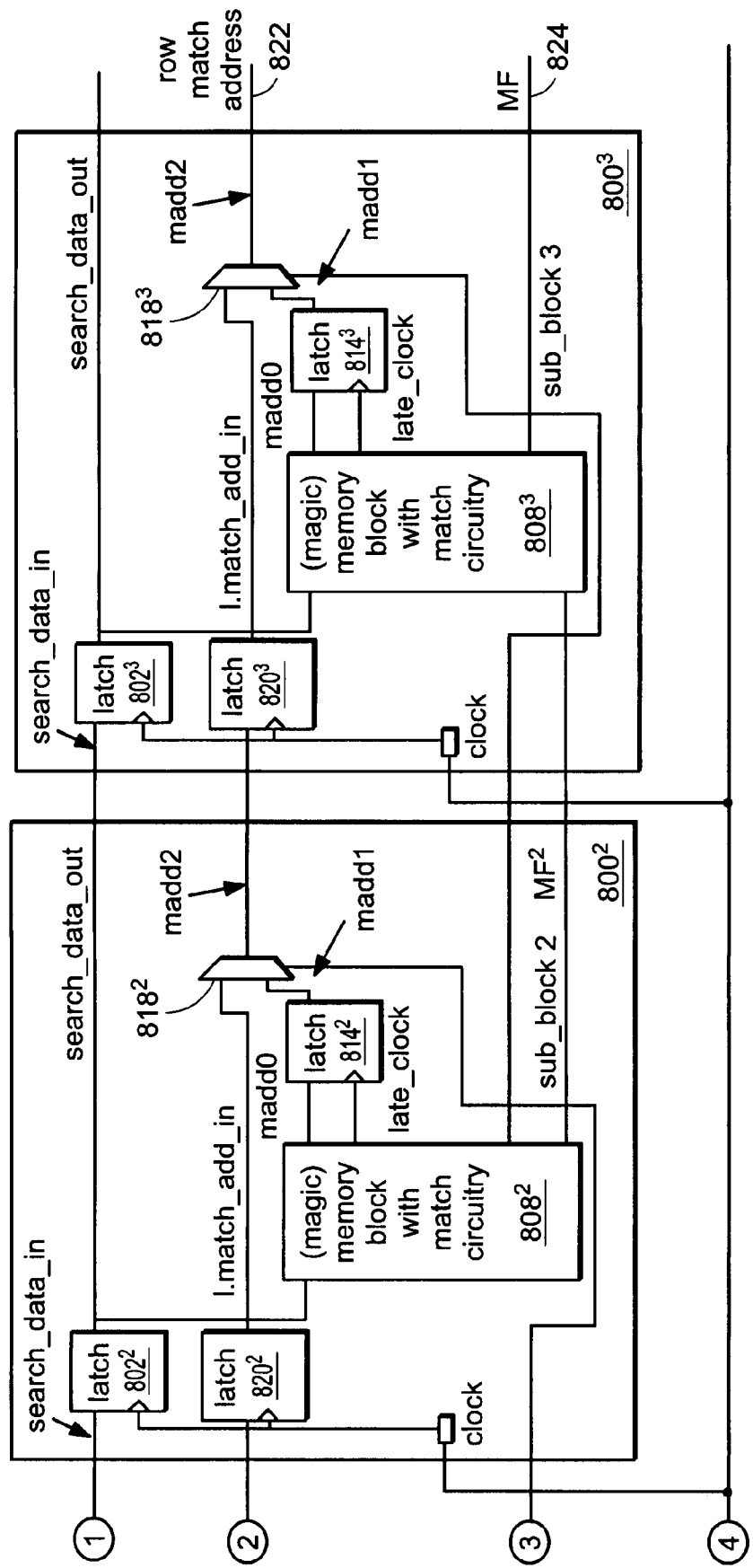

FIG. 8A-8B is a block diagram illustrating the search and compare path across a row of sub-blocks $800^0$-$800^3$ in the CAM 200 shown in FIG. 2A. The sub-block 800 has already been described in conjunction with FIG. 3. Each sub-block $800^0$-$800^3$ performs a search for search data 804 in a memory and match circuitry 808. The latched result of the search (madd1) or the highest priority matching address forwarded from higher priority sub-blocks (1—match—add—in) is forwarded as the highest priority matching address (madd2) to the next sub-block.

Each sub-block 800 includes a latch 802 for latching search data 804 received by the sub-block in order to increase latency at higher clock speeds. In the embodiment shown, the latched search data 806 is coupled to the memory and match circuitry 808. As already discussed in conjunction with FIG. 6A-6B to decrease latency at lower clock speeds, the latch 802 can be bypassed and the search data forwarded directly to the memory and match circuitry 808. Each sub-block 800 also includes a latch 820 for latching a match address received from the previous sub-block. The latch 820 can be bypassed and the match address forwarded directly.

The memory and match circuitry 808 includes the cell-arrays, 300a-d, priority encoders 306a, 306b and priority encoder output logic 314 already described in conjunction with FIG. 3. Each sub-block 800 performs a search in the cell-arrays in the memory and match circuitry 808 for a matching entry. Upon finding a matching entry, the address of the matching entry is output on madd0 810.

The latched match address (madd1) from the memory and match circuitry 808 and the latched match address (1_match_add_in) received from the previous sub-block 812 are coupled to inputs of a multiplexer 818. The latched match address from the previous block 812 is forwarded as the sub-block match address through multiplexor 818 if there was a hit; that is, a matching entry in the previous sub-block. The indication of a hit in the previous sub-block, a match flag (MF) is forwarded from the previous block to control the multiplexer. If there was a hit in the previous sub-block, the highest priority match address from the previous sub-block is forwarded through the multiplexor 818 as the sub-block match address (madd2).

If there is a matching entry, the address of the matching entry (madd2) is forwarded to the next sub-block. A latch 814 latches the matching address output on madd0 810 from the memory and match circuitry 808 on the rising edge of late clock 816. The late clock 816 is a delayed version of the clock which latches the search data in latch 802 and match address (madd2) in latch 820. After all sub-blocks in the row have been searched, the row match address 822 output from sub-block $800^3$ in the last column of the row is the highest priority match address for the row. The match flag output 824 from the last column is the match flag for the row.

Figure 9:
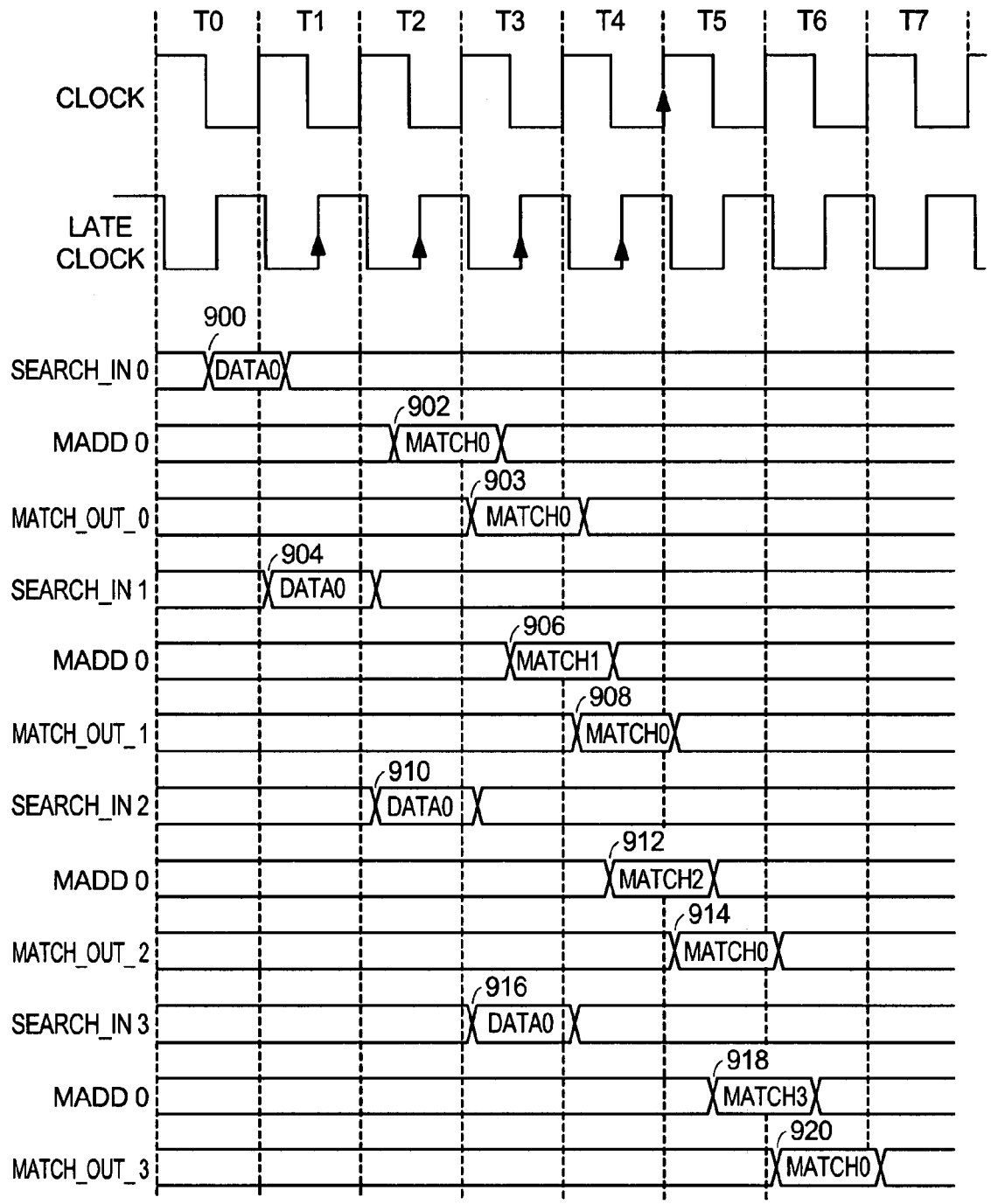
FIG. 9 is a timing diagram illustrating a search and compare operation across all the sub-blocks in a row of the CAM array shown in FIG. 7 with all pipeline stages enabled.

FIG. 9 is a timing diagram illustrating a search and compare operation across all the sub-blocks in a row of the CAM array shown in FIG. 8A-8B with all pipeline stages enabled. The timing diagram is described in conjunction with FIG. 8A-8B. In the example search operation shown, there is a hit in each of the sub-blocks and sub-block $800^0$ has the highest priority. Thus, as shown, the match address from sub-block $800^0$ (match0) is propagated across all the sub-blocks and output as the highest priority match address for the row.

At time 900, in clock period T0, search data 804 arrives at the search_data_in inputs of sub-block $800^0$ for a request to search for an entry storing the search data. In T1 after the rising edge of the clock 818, the search data is latched by latch $802^0$ and provided to the inputs of the memory and match circuitry $808^0$ to start the search for an entry storing the search data.

At time 902, in clock period T2, match0 the match address result from the search of memory and match circuitry $808^0$ in sub-block 0 is output on madd0 $810^0$. The match address madd0 is latched by latch $814^0$ on the rising edge of the late clock and the latched match address madd1 is provided to the input of multiplexor $818^0$. Multiplexor $818^0$ is controlled by the match flag from the previous sub-block. The state of the match flag from the previous sub-block determines whether the match address from the previous block is selected and forwarded through the multiplexor to the next sub-block. If the CAM is not coupled to another CAM, sub-block $800^0$ is the first sub-block in the row, match0 on madd1 is the highest priority match address and is forwarded to the output of the multiplexor. If the CAM in FIG. 8A-8B is coupled to another CAM, a match address and a match flag from the previous CAM, having higher priority is input to the first sub-block $808^0$. The output of multiplexor $818^0$ is coupled to the input of latch $820^1$.

At time 903, the rising edge of the clock latches match0 at the input of latch $820^1$ to forward match0 on match_add_out_1 to multiplexor $818^1$ in the next sub-block $800^1$.

At time 904, the rising edge of the clock latches the search data output from latch $802^0$. The latched search data is propagated through sub-block $800^0$ to the input of latch $802^1$ in sub-block $800^1$. The search data is latched by latch $802^1$ and provided to the inputs of the memory block and match circuitry $808^1$ to start the search for an entry storing the search data.

At time 906, match1, the match address from the search of memory and match circuitry $808^1$ in sub-block 1 is output on madd0 $810^1$. The match address madd$0^1$ is latched by latch $814^1$ and the latched match address madd1 is provided to the input of multiplexor $818^1$. Multiplexor $818^1$ is controlled by the match flag output from the previous sub-block 0 $800^0$. The state of match flag of sub-block0 $800^0$ determines whether the match address from sub-block 0 $800^0$ is selected and forwarded to the next sub-block. As sub-block $808^1$ is the second sub-block in the row, match0 match_add_in_1 is the highest priority match address and is forwarded to the output of the multiplexer $818^1$. The output of multiplexor $818^1$ is coupled to the input of latch $820^2$.

At time 908, the rising edge of the clock latches match0 at the input of latch $820^1$ to forward match0 on match_out_1 to multiplexor $818^2$ in the next sub-block $800^2$.

At time 910, the rising edge of the clock latches the search data output from latch $802^1$. The latched search data is propagated through sub-block $800^1$ to the input of latch $802^2$ in sub-block $800^2$. The search data is latched by latch $802^2$ and provided to the inputs of the memory block and match circuitry $808^2$ to start the search for an entry storing the search data.

At time 912, match2, the match address from the search of memory and match circuitry $808^2$ in sub-block 2 is output on madd0 $810^2$. The match address madd0 is latched by latch $814^2$ and the latched match address madd1 is provided to the input of multiplexor $818^2$. Multiplexor $818^2$ is controlled by the match flag of the previous sub-block 1 $800^1$. The state of the match flag of the sub-block0 $800^1$ determines whether the match address from the sub-block1 $800^1$ is selected and forwarded to the next sub-block The highest priority address, match0 is forwarded to the output of the multiplexer $818^2$. The output of multiplexor $818^2$ is coupled to the input of latch $820^3$.

At time 914, the rising edge of the clock latches match0 at the input of latch $820^2$ to forward match0 on match_add_out_2 to multiplexor $818^3$ in the next sub-block $800^3$.

At time 916, the rising edge of the clock latches the search data output from latch $802^2$. The latched search data is propagated through sub-block $800^2$ to the input of latch $802^3$ in sub-block $800^3$. The search data is latched by latch $802^3$ and provided to the inputs of the memory block and match circuitry $808^3$ to start the search for an entry storing the search data.

At time 918, match3, the match address from the search of memory and match circuitry $808^3$ in sub-block 3 is output on madd0 $810^3$. The match address madd0 is latched by latch $814^3$ and the latched match address madd1 is provided to the input of multiplexor $818^3$. Multiplexor is controlled by a match flag of the previous sub-block 2 $800^2$. The state of the match flag of the sub-block0 $800^2$ determines whether the match address from the sub-block2 $800^2$ is selected and forwarded to the next sub-block. The highest priority address, match0 is forwarded to the output of the multiplexor $818^3$. The output of multiplexor $818^3$ is the row match address 822.

At time 920, the rising edge of the clock latches match0 as the row match address 822.

Thus, with all pipeline stages enabled, the latency is seven clock cycles (T1-T7). The latency is the number of cycles between the edge of the clock at which search data is provided until the edge of the clock when the match address, which is the result of the search for the search data, can be latched. As shown in FIG. 9, the search data is provided at the end of clock cycle T0 and the match address can be latched at the end of clock cycle T7. The seven clock cycle latency includes two clock cycles for searching memory in a sub-block, four clock cycles (one per sub-block) for the pipeline and one clock cycle for latching the match address for the row. With all pipeline stages disabled, the latency is three clock cycles, two clock cycles for searching memory in each sub-block and one clock cycle for latching the match address from the last priority encoder. The number of pipeline stages enabled is dependent on the clock speed.

The invention has been described for a search and compare operation in the CAM, however the invention also applies to a write or a read operation in the CAM as is well-known to those skilled in the art.

While this invention has been particularly shown and described with references to preferred embodiments thereof, it will be understood by those skilled in the art that various changes in form and details may be made therein without departing from the scope of the invention encompassed by the appended claims.

What is claimed is:

1. A Content Addressable Memory comprising:
    a two-dimensional array of content addressable memory sub-blocks, each sub-block comprising a cell array that facilitates an operation on data and a sub-block priority encoder that processes results of the operation;
    a plurality of data inputs, each coupled to a respective sub-block in a first column of the array;
    a plurality of interconnections, each coupled to a pair of adjacent sub-blocks in a row of the array, that pass data and results of the operations across rows of the array; and
    a plurality of data outputs, each coupled to a respective sub-block in a last column of the array.

2. The Content Addressable Memory of claim 1, wherein each sub-block further comprises a plurality of cell arrays.

3. The Content Addressable Memory of claim 2, wherein each cell array includes a plurality of Content Addressable Memory cells and a plurality of match lines, the match lines configured to provide a match indication for a word stored in a row of Content Addressable Memory cells.

4. The Content Addressable Memory of claim 1, wherein each sub-block further comprises a pipeline stage that latches the data and the results of the operation.

5. The Content Addressable Memory of claim 4 further comprising a clock signal coupled to each sub-block such that each pipeline stage latches the data and results of the operation in response to an edge of the clock signal.

6. The Content Addressable Memory of claim 1 wherein the operation is a search-and-compare.

7. The Content Addressable Memory of claim 6 wherein the results include a match flag and a match address.

8. The Content Addressable Memory of claim 7 wherein data and results propagate across respective rows of the array.

9. The Content Addressable Memory of claim 7 further comprising priority encoder logic, coupled to the plurality of outputs, that encodes match flags from rows of sub-blocks.

10. The Content Addressable Memory of claim 1 further comprising priority encoder logic, coupled to the plurality of outputs, that outputs the results of the operation in order of priority.

11. A Content Addressable Memory comprising:
    a two-dimensional array of content addressable memory sub-blocks, each sub-block comprising a cell array that facilitates an operation on data;
    a plurality of data inputs, each coupled to a respective sub-block in a first column of the array;
    a plurality of interconnections, each coupled to a pair of adjacent sub-blocks in a row of the array, that pass data and results of the operations across rows of the array; and
    priority encoder logic that processes data and results of the operations from sub-blocks in a last column of the array.

12. The Content Addressable Memory of claim 11 wherein each sub-block further comprises a plurality of cell arrays.

13. The Content Addressable Memory of claim 12, wherein each cell array includes a plurality of Content Addressable Memory cells and a plurality of match lines, the match lines configured to provide a match indication for a word stored in a row of Content Addressable Memory cells.

14. The Content Addressable Memory of claim 11, wherein each sub-block further comprises a pipeline stage that latches the data and the results of the operation.

15. The Content Addressable Memory of claim 14 further comprising a clock signal coupled to each sub-block such that the pipeline stage latches the data and results of the operation in response to an edge of the clock signal.

16. The Content Addressable Memory of claim 11 wherein each sub-block further comprises a sub-block priority encoder that processes results of the operation.

17. The Content Addressable Memory of claim 16 wherein the operation is a search for a match for data and the results of the operation include a match flag and a sub-block match address.

18. The Content Addressable Memory of claim 17 wherein data and results propagate across respective rows of the array.

19. The Content Addressable Memory of claim 18 wherein the priority encoder logic sorts the results of the search in order of priority to provide the results of the operation.

20. The Content Addressable Memory of claim 18 wherein the priority encoder logic encodes match flags to provide the results of the operation.

* * * * *